(12) United States Patent
Azad

(10) Patent No.: US 10,418,767 B2
(45) Date of Patent: Sep. 17, 2019

(54) ADJUSTABLE IMPEDANCE HIGH SPEED DATA CONNECTOR, AND METHODS OF ASSEMBLING AND OPERATING THEREOF

(71) Applicant: J.S.T. CORPORATION, Farmington Hills, MI (US)

(72) Inventor: Vikas Azad, Novi, MI (US)

(73) Assignee: J.S.T. CORPORATION, Farmington Hills, MI (US)

( * ) Notice: Subject to any disclaimer, the term of this patent is extended or adjusted under 35 U.S.C. 154(b) by 0 days.

(21) Appl. No.: 15/993,921

(22) Filed: May 31, 2018

(65) Prior Publication Data

US 2019/0013632 A1    Jan. 10, 2019

Related U.S. Application Data

(60) Provisional application No. 62/529,704, filed on Jul. 7, 2017.

(51) Int. Cl.
*H01R 13/66* (2006.01)
*H01R 31/06* (2006.01)
(Continued)

(52) U.S. Cl.
CPC .......... *H01R 31/065* (2013.01); *H01R 13/506* (2013.01); *H01R 13/6473* (2013.01);
(Continued)

(58) Field of Classification Search
CPC .... H01R 13/66; H01R 24/50; H01R 13/6625; H01R 13/6633; H01R 13/6466; H01R 13/6658; H01R 12/716; H01R 13/5213; H01R 24/54; H01R 33/94; H01R 31/06; H01R 9/223; H01R 13/502; H01R 13/516

USPC ............ 439/620.01, 620.06, 620.09, 620.24, 439/620.25, 76.1, 654, 638, 731, 465, 439/687, 696

See application file for complete search history.

(56) References Cited

U.S. PATENT DOCUMENTS

| | | | | |
|---|---|---|---|---|
| 3,386,010 A | * | 5/1968 | Takasi Nojiri | ....... H05K 7/1053 361/728 |
| 5,639,262 A | * | 6/1997 | Lim | ...................... H01R 31/06 439/607.38 |

(Continued)

*Primary Examiner* — Tulsidas C Patel
*Assistant Examiner* — Justin M Kratt
(74) *Attorney, Agent, or Firm* — Kratz, Quintos & Hanson, LLP

(57) ABSTRACT

An adjustable impedance high speed data connector, and methods for assembling and operating thereof. The adjustable impedance high speed data connector of this invention includes a printed circuit board accommodated within, or printed or stamped onto, a tray, the printed circuit board including sets of terminals respectively extending on opposite ends of the printed circuit board. Mounted onto the printed circuit board and electrically connected thereto is at least one electric module having a fixed or adjustable capacitance or a fixed or adjustable inductance, which may be combined in any desired combination to achieve a desired impedance for the connector. By adjusting the variable capacitance or inductance of the electric module (or the variable combinations of capacitance and/or inductance of a plurality of electric modules), the impedance within the connector is adjustable for allowing the connector to operate at various ranges of bandwidths.

15 Claims, 9 Drawing Sheets

(51) Int. Cl.
*H05K 5/00* (2006.01)
*H05K 1/18* (2006.01)
*H01R 43/20* (2006.01)
*H01R 13/506* (2006.01)
*H01R 13/6473* (2011.01)
*H05K 1/02* (2006.01)
*H01R 24/50* (2011.01)
*H01R 9/22* (2006.01)
*H01R 12/71* (2011.01)
*H01R 13/516* (2006.01)
*H01R 13/6466* (2011.01)
*H01R 33/94* (2006.01)
*H01R 13/52* (2006.01)
*H01R 13/502* (2006.01)
*H01R 24/54* (2011.01)

(52) U.S. Cl.
CPC ..... *H01R 13/6625* (2013.01); *H01R 13/6658* (2013.01); *H01R 43/205* (2013.01); *H05K 1/181* (2013.01); *H05K 5/0052* (2013.01); *H05K 5/0069* (2013.01); *H01R 9/223* (2013.01); *H01R 12/716* (2013.01); *H01R 13/502* (2013.01); *H01R 13/516* (2013.01); *H01R 13/5213* (2013.01); *H01R 13/6466* (2013.01); *H01R 13/66* (2013.01); *H01R 13/6633* (2013.01); *H01R 24/50* (2013.01); *H01R 24/54* (2013.01); *H01R 31/06* (2013.01); *H01R 33/94* (2013.01); *H05K 1/0231* (2013.01); *H05K 1/0233* (2013.01); *H05K 1/0286* (2013.01); *H05K 2201/0999* (2013.01); *H05K 2201/1034* (2013.01); *H05K 2201/10196* (2013.01)

(56) References Cited

U.S. PATENT DOCUMENTS

| 7,500,880 B1* | 3/2009 | Vaziri | H01R 31/005 439/638 |
| 2008/0032554 A1* | 2/2008 | Kuo | H01R 31/06 439/607.41 |
| 2012/0309233 A1* | 12/2012 | O'Malley | H01R 13/6469 439/626 |
| 2012/0319697 A1* | 12/2012 | Gregg | G01R 31/2822 324/511 |

* cited by examiner

ADJUSTABLE IMPEDANCE HIGH SPEED DATA CONNECTOR, AND METHODS OF ASSEMBLING AND OPERATING THEREOF

CROSS-REFERENCE TO RELATED APPLICATIONS

This patent application claims priority to U.S. Provisional Patent Application No. 62/529,704 filed Jul. 7, 2017, which is hereby incorporated herein by reference in its entirety.

BACKGROUND OF THE INVENTION

A conventional high speed data (HSD) connector requires a twisted pair of data transfer elements (e.g., a twisted pair of cables or the like), which reduces the effects of electromagnetic interference (noise) on an electric signal. By twisting the data transfer elements or cables around each other, any interference affecting one will also affect the other typically causing a rise or drop in voltage in both. As the signal is read based on the difference between the two data transfer elements, the difference remains the same regardless on whether the signals passing through both transfer elements move increases or decreases. The conventional HSD connector, which employs the twisted data transfer elements, thus eliminates impedance matching, but does not have variability when used in a tooling or equipment having different bandwidth and impedance. Moreover, the conventional HSD connector, with the twisted data transfer elements, requires special handling when re-tooling a connector requiring different bandwidths and impedances.

SUMMARY OF THE INVENTION

This invention generally relates to an adjustable impedance high speed data connector, and methods for assembling and operating thereof. More particularly, the adjustable impedance high speed data connector of this invention includes a printed circuit board accommodated within, or printed or stamped onto a tray, the printed circuit board having sets of terminals (e.g., a set of input terminals and a set of output terminals) respectively extending on opposite ends of the printed circuit board. Mounted onto the printed circuit board and electrically connected thereto is at least one electric module having a capacitance, inductance, or a resulting impedance. The electric modules, each having a capacitance or inductance, may be combined in any desired combination to achieve a resulting impedance for the connector. Each of the electric modules may also be independently adjustable. Such electric module includes an adjustable means, either mechanical or electrical, for adjusting at least one of the capacitance and inductance of each of the electric modules so as to adjust the resulting impedance of the high speed data connector of this invention.

With the adjustability of the resulting impedance of the electric modules, the output impedance of the connector becomes substantially the same as the input impedance; thus, any effect of electro-magnetic interference on the electrical signal passing through the circuit within the printed circuit board of the connector is reduced. Moreover, by adjusting the capacitance or inductance of each of the electric modules or combining the electric modules each having a capacitance or inductance, the adjustable impedance high speed data connector of this invention may be used in various ranges of bandwidths. Thus, the need to re-tool the connector for use in different bandwidths and impedances can be avoided or altogether eliminated.

Moreover, the adjustable impedance high speed data connector of this invention can be used with standard cables, which provides for easy assembly and handling. By adjusting the variable capacitance or inductance of the electric module (or the variable combinations of capacitance and/or inductance of a plurality of electric modules), the impedance within the connector is adjustable for allowing the connector to operate at various ranges of bandwidths.

Additional features, advantages, and embodiments of the invention are set forth or apparent from consideration of the following detailed description, drawings, and claims. Moreover, it is to be understood that both the foregoing summary of the invention and the following detailed description are exemplary and intended to provide further explanations without limiting the scope of the invention as claimed.

DETAILED DESCRIPTION OF THE PREFERRED EMBODIMENTS

Figure 1:
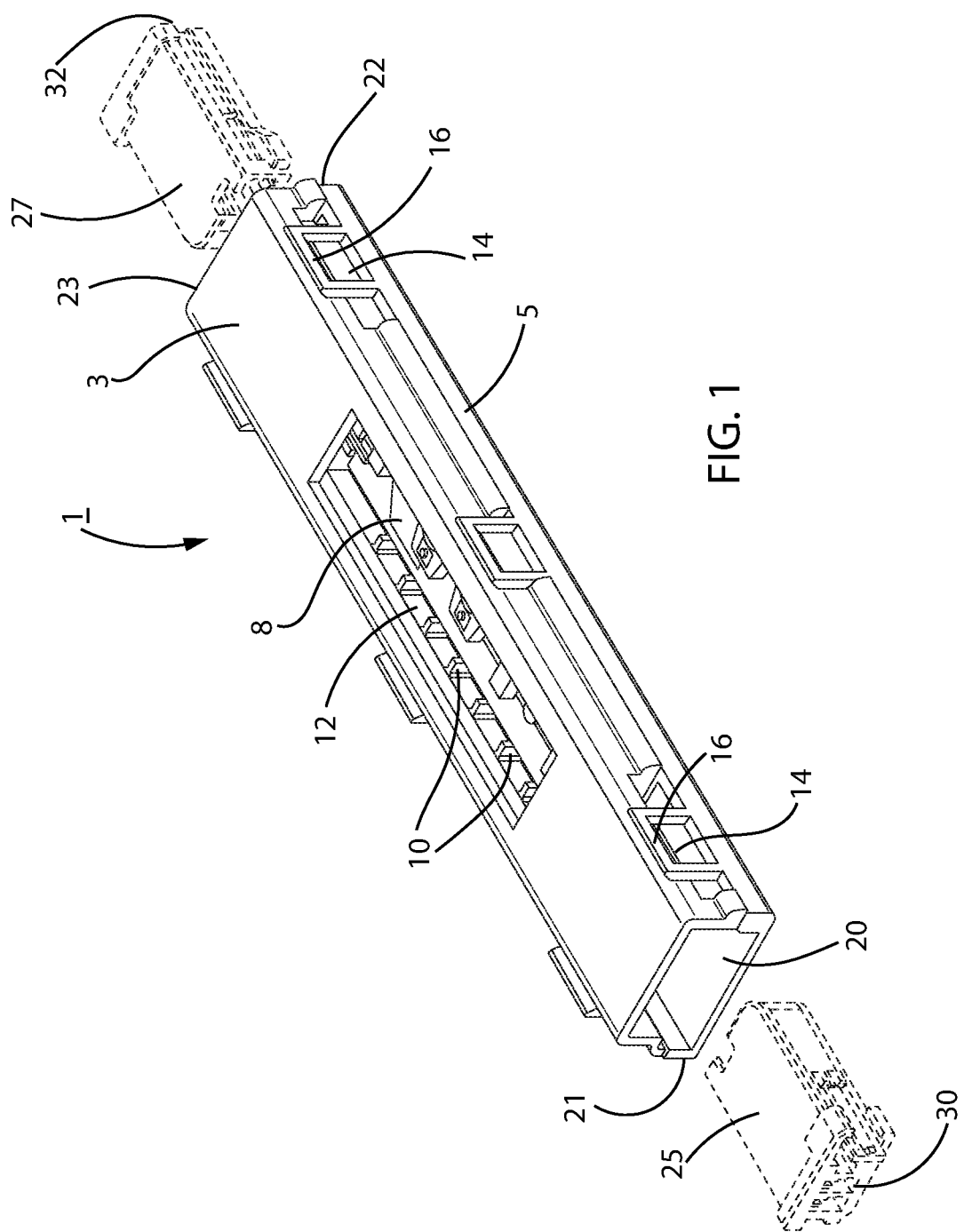
FIG. 1 is a perspective view of the adjustable impedance high speed data connector of this invention.

FIG. 1 is a perspective view of the adjustable impedance high speed data connector of this invention, generally referred to by reference number 1. The connector 1 includes a cover and a tray 5. Contained within the cover 3 and the tray 5 (and mounted onto the tray 4) is a printed circuit board 8. So as to secure the printed circuit board 8 within the tray 5 covered by the cover 3, guide members 10 extend from the inner sides 12 of the tray 5. The cover 3 includes at least a first protruding latch 14, while the tray 5 includes at least a second protruding latch 16, the first and second protruding latches 14, 16 capable of engaging with each other to secure the cover 3 onto the tray 5.

When the cover 3 is secured onto the tray 5 with the first and second protruding latches 14, 16 the adjustable impedance high speed data connector 1 includes a first inlet 20 passing through a first end 21 of the connector 1 and a second inlet 22 passing through a second end 23 of the connector 1, the first end 21 and the second end 23 being at opposite ends of the connector 1. As further illustrated in FIG. 1, the first inlet 20 of the first end 21 accommodates therein a first connector assembly 25 with a first set of terminal apertures 30 capable of having a first set of terminals (not shown) and being inserted therein for connection with the printed circuit board housed within the connector 1. Similarly, the second inlet 22 of the second end 23 accommodates therein a second connector assembly 27 with a second set of terminal apertures 32 capable of having a second set of terminals (not shown) and being inserted therein for connection with the printed circuit board housed within the connector 1.

Figure 2:
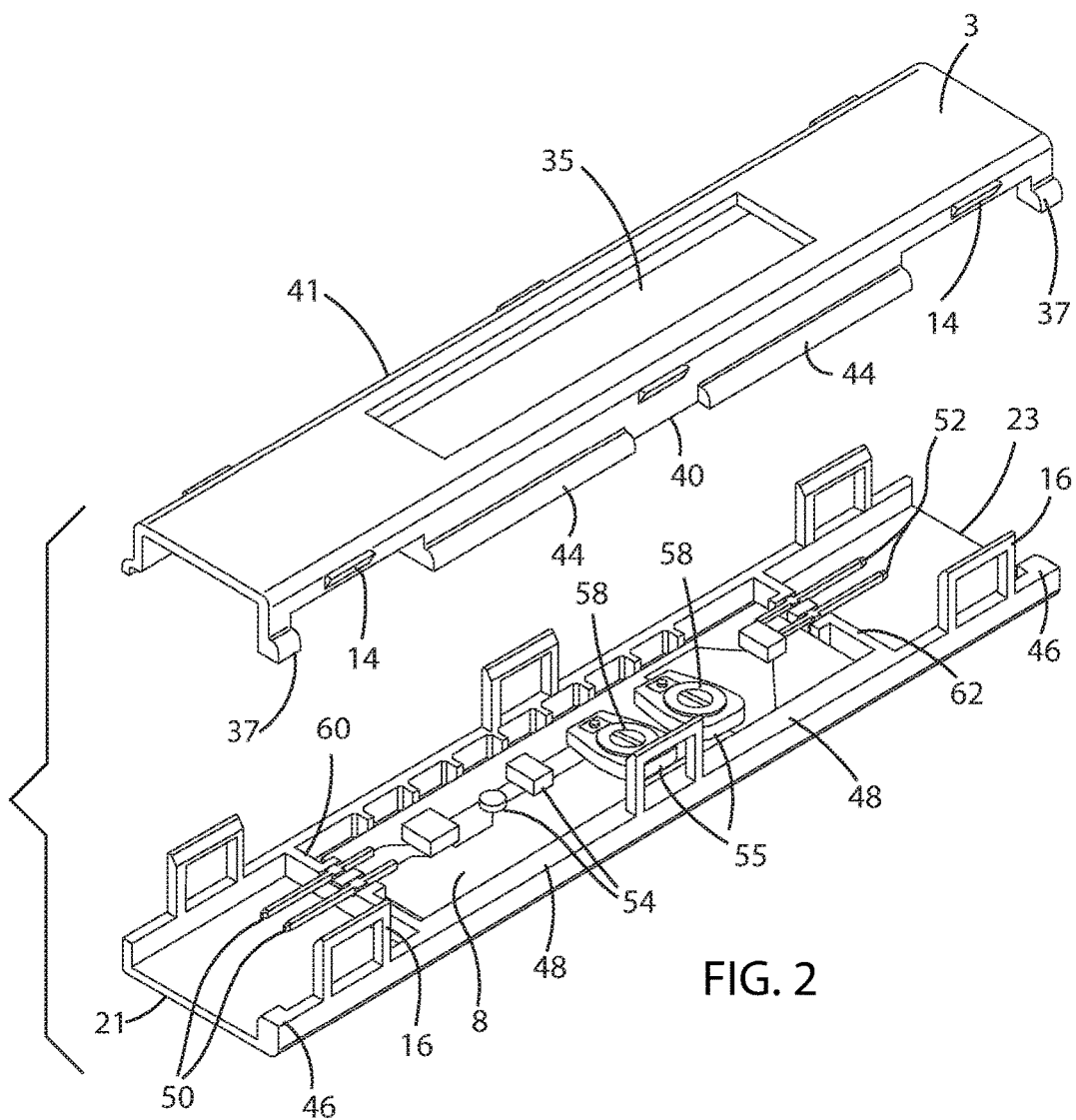
FIG. 2 is a partial exploded view of the first embodiment of the adjustable impedance high speed data connector of this invention showing a cover and a tray for accommodating therein a printed circuit board with at least an electric module having an adjustable capacitance or an adjustable inductance.

The first embodiment of the adjustable impedance high speed data connector 1 illustrated in FIG. 2 shows the cover 3 having an elongated window 35 passing through an upper portion thereof The cover 3 includes leg portions 37 at corners thereof. At sides 40, 41 of the cover 3 are side leg portions 44. Upon assembly, the leg portions 37 mount onto the corresponding corner ledge portions 46 at corners of the tray 5, while the side ledge portions 44 mount onto corresponding side ledge portions 48 of the tray 5.

Secured onto the tray 5 is the printed circuit board 8 having sets of end terminals 50, 52, circuit elements 54, and electric modules 55. The printed circuit board 8 is secured onto the tray 5 by the guide members 10 extending from the inner sides 12 of the tray 5, while the end terminals 50, 52 are secured within upstanding member 60, 62, respectively. The end terminals 50 connect to the first connector assembly 25 (or the second connector assembly 27) (see, FIG. 1), while the end terminals 52 connect to the second connector assembly 27 (or the first connector assembly 25) (see, also, FIG. 1). The printed circuit board 8 is secured onto the tray 5 on its four sides by the guide members 10 and the end guide members 65, 67 (see, FIG. 3) of the tray 5.

Electric modules 55 are mounted onto the printed circuit board 8 and connected thereto (by solder, glue, or the like). Each of the electric modules 55 may be an adjustable capacitance modules or an adjustable inductance modules, and includes on an upper portion thereof a rotatable screw-type head portion 58. The rotatable screw-type head portion 58 of the module 55 may be rotated by a tool (a screwdriver, or the like) for adjusting therein the capacitance or the inductance of the electric module 55. The adjustments of the capacitances or inductances of the various electric modules 55, at varying degrees, allows for the impedance of the printed circuit board to be adjusted to a desired value.

Figure 3:
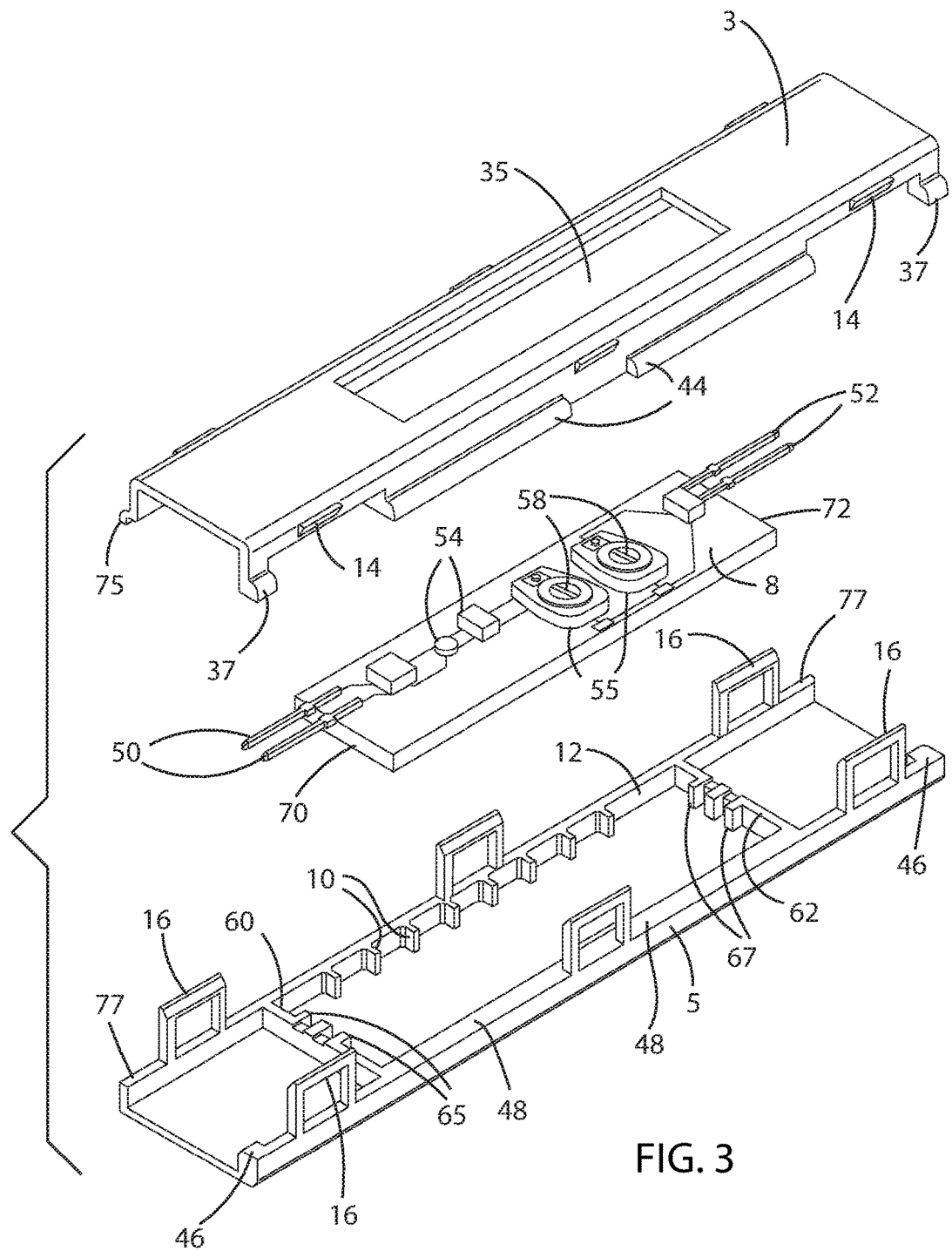
FIG. 3 is an exploded view of the first embodiment of the adjustable impedance high speed data connector of this invention showing the cover, the tray, and the printed circuit board having at least an adjustable capacitance or inductance electric module mounted thereon.

FIG. 3 is a full exploded view of the first embodiment of the connector 1 of this invention, as also shown (in a partial exploded view) in FIG. 2. The tray 5 is shown with the second latches 16 extending therefrom, guide members 10 extending from the inner sides 12, corner ledge portions 46, and upstanding members 60, 62, the later having end guide members 65, 67, respectively, extending therefrom, for guiding and securing the end portions 70, 72 of the printed circuit board 8, respectively. The printed circuit board includes thereon the circuit elements 54 and the electric modules 55.

The upstanding members 60, 62 of the tray 5 are for securing and mounting thereon the sets of end terminals 50, 52, respectively, of the printed circuit board 8. Upon assembly, the leg portions 37 of the cover 3 respectively mount onto the cover ledge portions 46 of the tray 5. The bottom end portions 75 of the cover 3 mount on respective end ledge portions 77 of the tray 5. The side ledge portions 44 of the cover 3 rests onto the corresponding side ledge portions 48 of the tray 5. As discussed earlier with respect to FIG. 1, the first protruding latches 14 of the cover 3 latch with the second protruding latches 16 of the tray 5 to house the printed circuit board 8 within the cover 3 and the tray 5.

Figure 4:
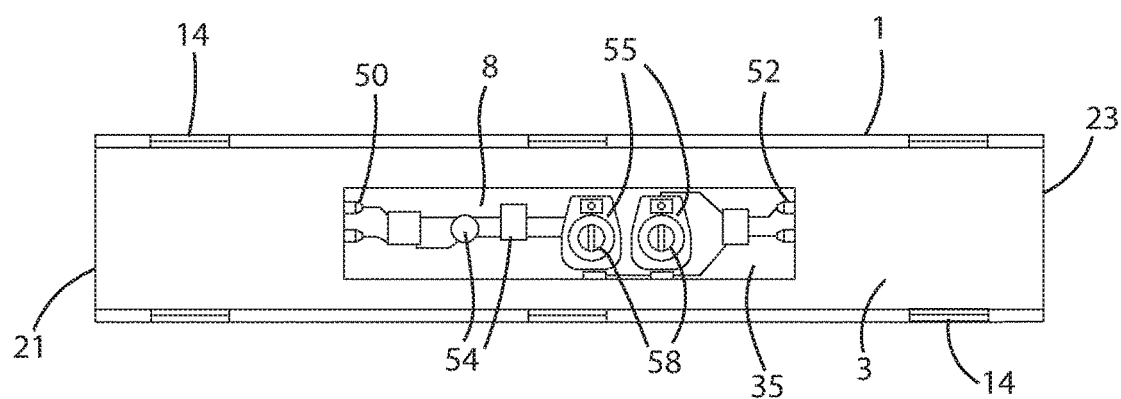
FIG. 4 is an elevational top view of the first embodiment of the adjustable impedance high speed data connector of this invention.

Upon assembling the printed circuit board 8 within the cover 3 and the tray 5 of the connector 1, the printed circuit board 8, having the circuit elements 54 and the electric modules 55 thereon, are visible through the elongated window 35 of the cover 3 (as illustrated in FIG. 4) for allowing each of the rotatable screw-type head portions 58 of the electric modules 55 to be adjusted by the tool for adjusting the capacitance or inductance of each of the electric modules 55.

Figure 5:
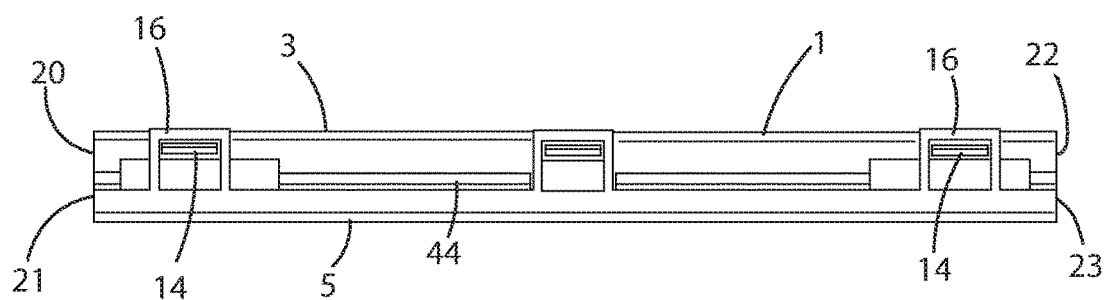
FIG. 5 is a first side elevational view of the adjustable impedance high speed data connector of this invention.
Figure 6:
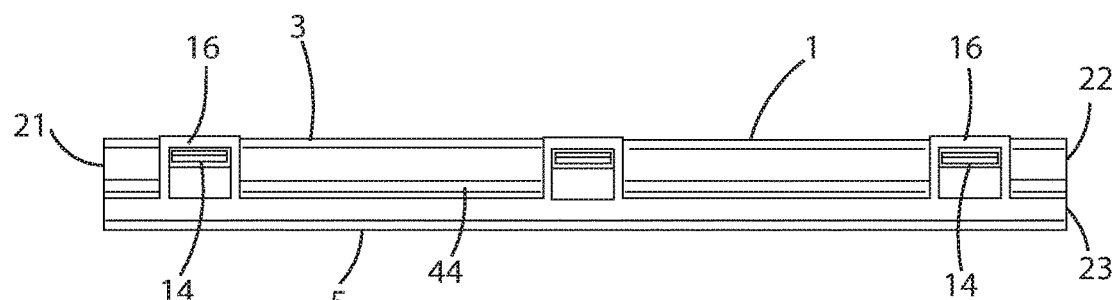
FIG. 6 is a second side elevational view of the adjustable impedance high speed data connector of this invention.

FIGS. 5 and 6 illustrate the fully assembled adjustable impedance high speed data connector 1 of this invention showing respective sides thereof with the first and second protruding latches 14, 16 fully connected or latched together. The fully assembled connector 1, as shown in FIGS. 4, 5, and 6, is ready to receive, through the first inlet 20 of the first end 21, the first connector assembly 25 and to receive, through the second inlet 22 of the second end 23, the second connector assembly 22. The first connector assembly 25 and the second connector assembly 27 are connected to the sets of end terminals 50, 52, respectively, of the printed circuit board 8.

Figure 7:
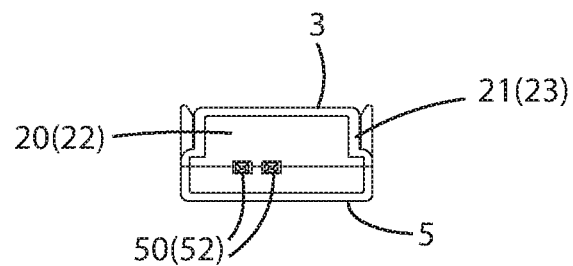
FIG. 7 is a first end elevational view of the adjustable impedance high speed data connector of this invention.
Figure 8:
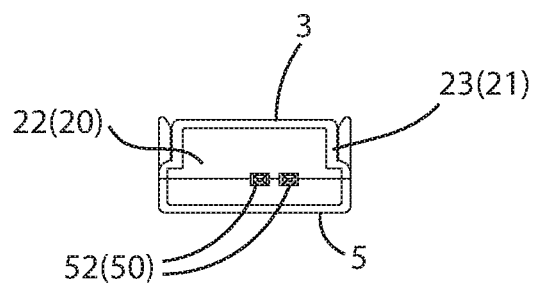
FIG. 8 is a second end elevational view of the adjustable impedance high speed data connector of this invention.

Shown in FIGS. 7 and 8 are each set of the end terminals 50 or 52 exposed through the first inlet 20 of the first end 21 or the second inlet 22 of the second end 23 for connecting thereto with the first connector assembly 25 or the second connector assembly 27 (see, FIG. 1).

Figure 9:
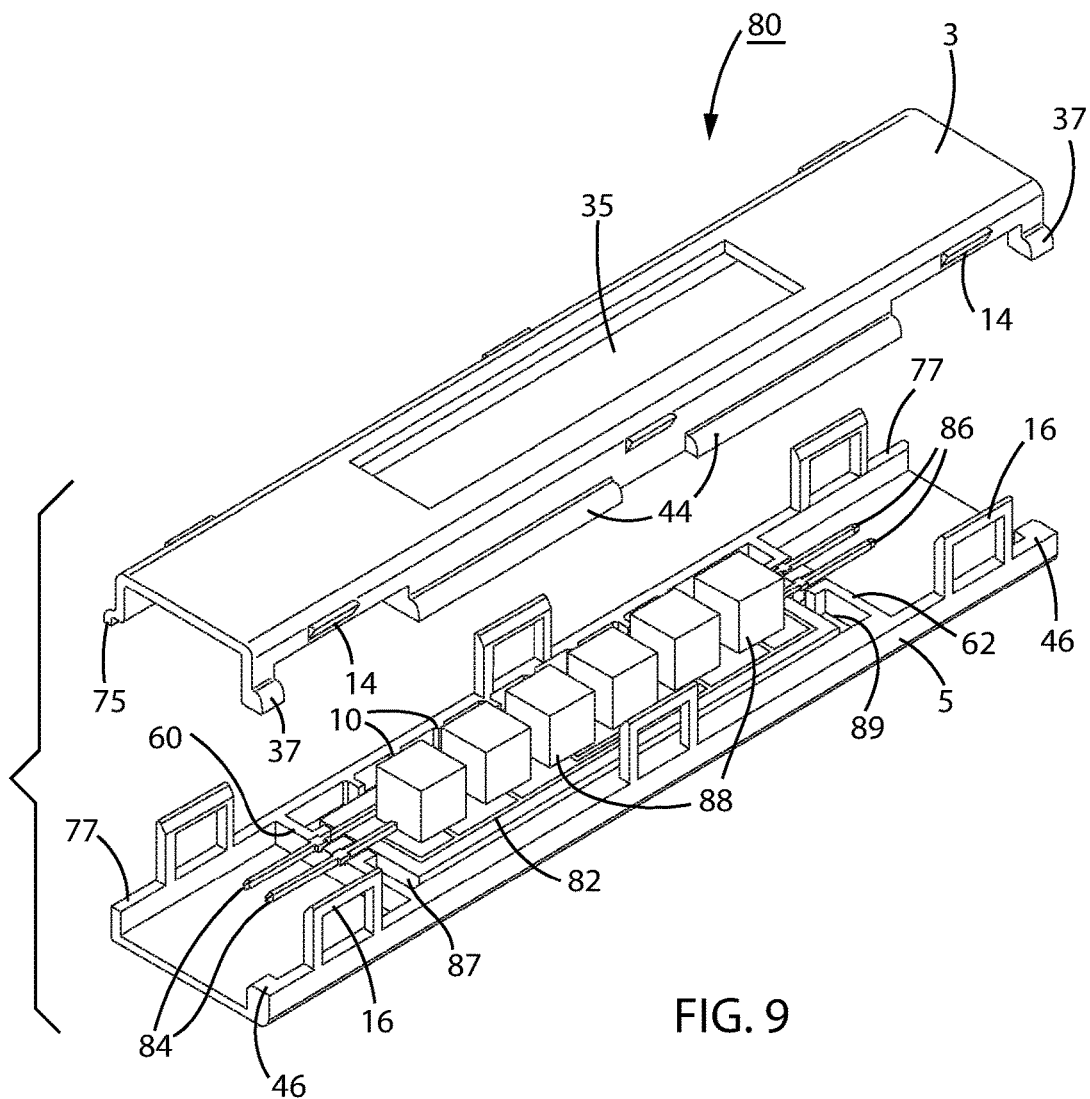
FIG. 9 is a partial exploded view of the second embodiment of the adjustable impedance high speed data connector of this invention showing a cover and a tray for accommodating therein a printed circuit board with at least an electric module mounted thereon, the electric module having a capacitance or an inductance therein.

A second embodiment of the adjustable impedance high speed data connector of this invention, generally designated as reference number 80, is shown in FIG. 9. Here, for the second embodiment of this invention, other than a printed circuit board 82 thereof, the same reference numbers are used for similar parts or elements as in the descriptions of the first embodiment; and thus, the description thereof are not described herein for the second embodiment.

As seen in FIG. 9, the printed circuit board 82 is guided and secured, by the guide members 10 and upstanding members 60, 62 of the tray 5, onto the tray 5. As in the first embodiment, sets of terminals 84, 86 extend at respective ends 87, 89 of the printed circuit board 82 of the second embodiment for connecting with the first connector assembly 25 or the second connector assembly 27 (see, FIG. 1). As further shown in FIG. 9, a combination of electric modules 88 having varying capacitances or varying inductances for providing the resulting impedance of the connector 80, which may be adjusted or varied. In other words, the resulting impedance of the connector 80 may be adjusted by varying the combinations of electric modules 88, each module 88 having a conductance or inductance, mounted onto the printed circuit board 82. That is, the electric modules 88, each having a specific capacitance or inductance, are mounted, in varying desired combinations to achieve a resulting impedance for the connector 80, the impedance of the connector 80 thereby being adjustable. The electric modules 8 are mounted onto the printed circuit board 82 and connected thereto (by solder, glue, or the like).

Figure 10:
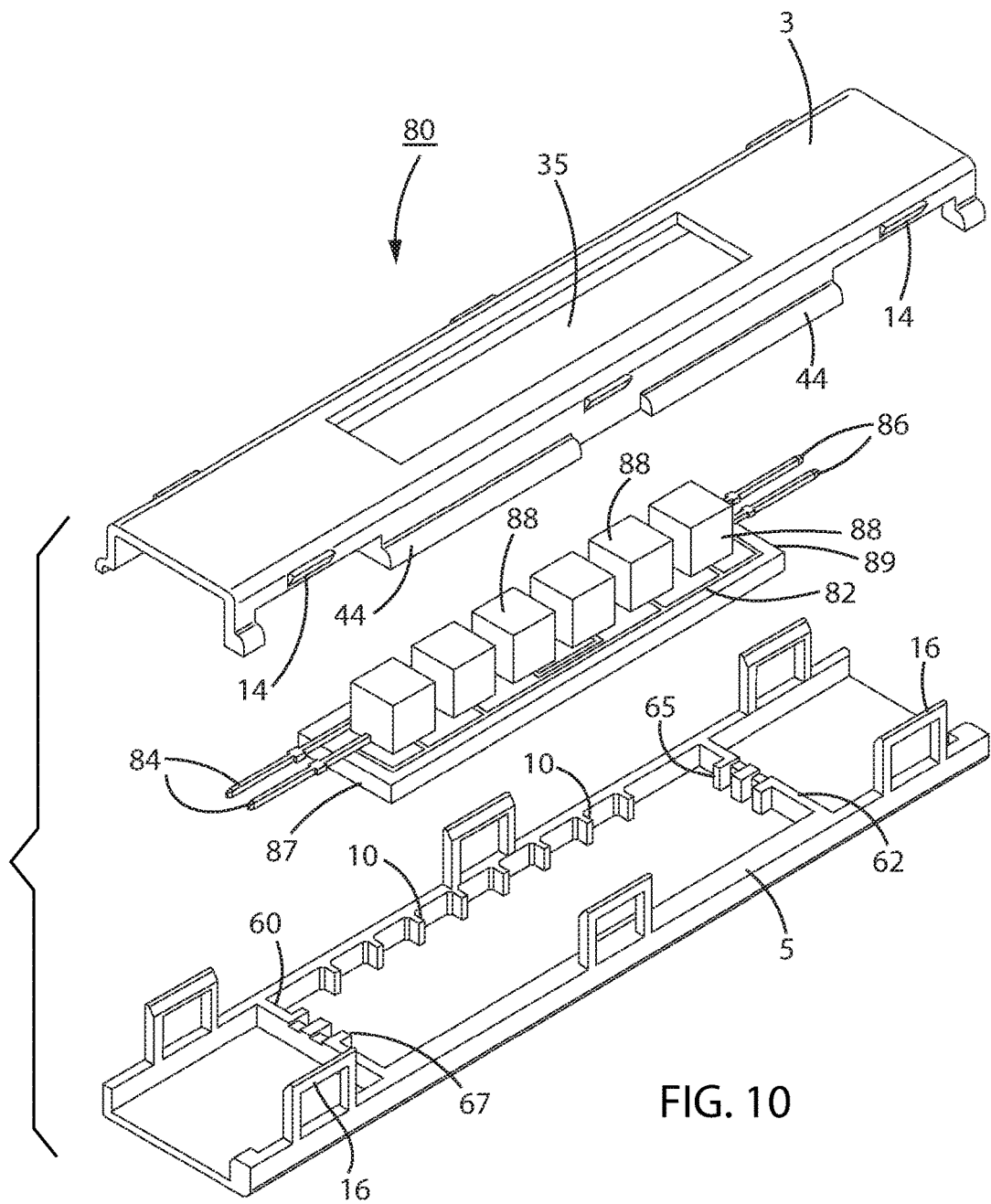
FIG. 10 is an exploded view of the second embodiment of the adjustable impedance high speed data connector of this invention showing the cover, the tray, and the printed circuit board having at least an electric module mounted thereon, the electric module having a capacitance or an inductance therein.

As in the first embodiment (see, FIG. 3), the printed circuit board 82 of the second embodiment, shown in FIG. 10, is guided, mounted, or secured, by the guide members 10 and upstanding members 60, 62 of the tray 5, onto the tray 5, and subsequently connected thereto (by solder, glue, or the like). The printed circuit board 82 is thereafter housed within the cover 3 and the tray 5, and secured therein with the first protruding latches 14 of the cover 3 locking with the second protruding latches 16 of the tray. Subsequently, the sets of terminals 84, 86 become available to connect with the first connector assembly 25 and the second connector assembly 27, respectively (see, FIG. 1).

Figure 11:
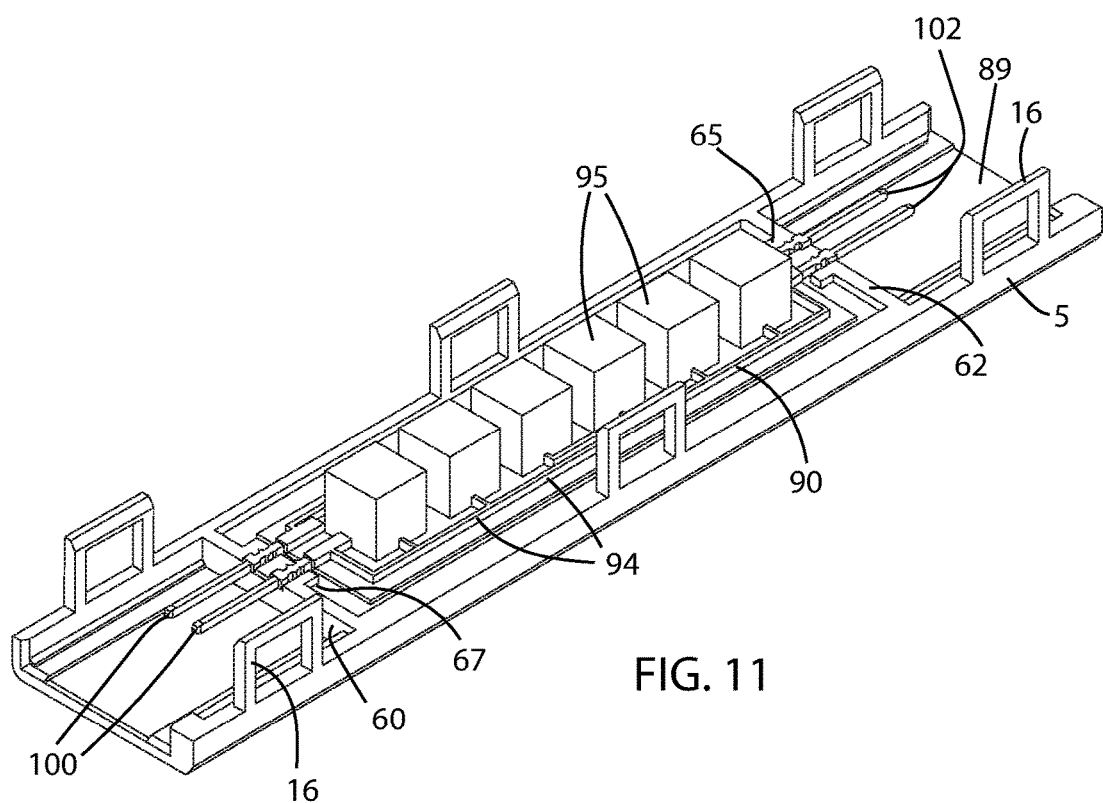
FIG. 11 is a perspective view of a third embodiment of the adjustable impedance high speed data connector of this invention showing the printed circuit board having circuit patterns or traces stamped into the tray, the printed circuit board having at least an electric module mounted thereon, the electrical module having a capacitance or an inductance therein.

FIG. 11 illustrates, in a perspective view, a third embodiment of the adjustable impedance high speed data connector of this invention showing a printed circuit board 90 having circuit patterns or traces 94 stamped into the tray 5, the printed circuit board 90 having at least an electric module mounted 95 thereon, the electrical module 95 having a capacitance or an inductance therein. For the third embodiment of this invention, other than the printed circuit board 90, the same reference numbers are used for similar parts or elements as in the descriptions of the second embodiment; and thus, the descriptions thereof are not described herein for the third embodiment.

The printed circuit board 90 of the third embodiment of this invention includes circuit patterns or traces 94 stamped into a floor 89 of the tray 5; and electric modules 95 are subsequently mounted onto the printed circuit board 90 and connected thereto (by solder, glue, or the like). The electric modules 95 may be similar to the electric modules 55 of the first embodiment or the electric modules of the second embodiment. Each of the electric modules 95 may, as in the second embodiment, have a conductance or an inductance that may vary so as to achieve an adjustable or varying resulting impedance for the connector.

Alternatively, the electric modules 95 may each, as in the first embodiment, include the rotatable screw-type head portion 58 (see, FIGS. 2, 3, and 4) for adjusting the conductance or inductance thereof by the tool (a screwdriver or the like) for allowing the overall adjustment of the resulting impedance of the connector.

The cover 3, as described above with respect to the first and second embodiments, may be similarly used in the third embodiment of this invention. The printed circuit board 90 of the third embodiment similarly includes sets of terminals 100, 102 and become available for connecting with the first connector assembly 25 and the second connector assembly 27 (see, FIG. 1), respectively, after the cover 3 is connected to the tray 5 in the manner described above with respect to the first and second embodiments.

With respect to the above-described first, second, and third embodiments of this invention, the adjustment of the impedance of the connector of this invention allows for impedance matching (i.e., $Z_{input} = Z_{output}$, $Z_{input}$ being the input impedance and $Z_{output}$ being the output impedance of the connector), which in turn allows for the reduction in noise or interference conducive to a favorable environment for a high speed signal passing through the connector of this invention. With the reduction of noise or interference and allowing for a high speed signal to pass through the connector of this invention, power can be maximized.

By adjusting the variable capacitance or inductance of the electric module (or the variable combinations of capacitance and/or inductance of the plurality of electric modules 55, 88, 95), the impedance within the connector is adjustable for allowing the connector to operate at various ranges of bandwidths.

Although the foregoing description is directed to the preferred embodiments of the invention, it is noted that other variations and modifications will be apparent to those skilled in the art, and may be made without departing from the spirit or scope of the invention. Moreover, features described in connection with one embodiment of the invention may be used in conjunction with other embodiments, even if not explicitly stated above.

I claim:

1. An adjustable impedance high speed data connector, comprising:
    a cover having at least a first protruding latch;
    a tray having at least a second protruding latch;
    a printed circuit board mounted, in its entirety, onto a floor of the tray, the printed circuit board having first and second sets of terminals extending on opposite ends thereof; and
    at least an electric module mounted onto the printed circuit board and connected thereto, the electric module having at least a capacitor or an inductor or a resistor,
        wherein the printed circuit board is housed within the cover and the tray with the first and second protruding latches connected to each other, and
        wherein the cover includes an elongated window spaced apart from the printed circuit board and above the at least an electric module mounted onto the printed circuit board for replacement or adjustment thereof through the elongated window thereabove.

2. The adjustable impedance high speed data connector as in claim 1, wherein the electric module has a fixed capacitor or a fixed inductor or a fixed resistor.

3. The adjustable impedance high speed data connector as in claim 1, wherein the electric module has an adjustable capacitor or an adjustable inductor or an adjustable resistor.

4. The adjustable impedance high speed data connector as in claim 2, wherein a plurality of electric modules includes a combination of at least a capacitor and an inductor and a resistor to achieve a resulting adjustable impedance for the connector.

5. The adjustable impedance high speed data connector as in claim 3, wherein a plurality of electric modules each having at least an adjustable capacitor or an adjustable inductor to achieve a resulting adjustable impedance for the connector.

6. The adjustable impedance high speed data connector as in claim 1, wherein the printed circuit board is patterned or sketched into the floor of the tray.

7. A method for assembling an adjustable impedance high speed data connector, comprising the steps of:
    providing a cover having at least a first protruding latch;
    providing a tray having at least a second protruding latch;
    housing a printed circuit board within the cover and the tray, the printed circuit board having first and second sets of terminals extending on opposite ends thereof, the printed circuit board being mounted, in its entirety, onto a floor of the tray;
    mounting a plurality of electric modules onto the printed circuit board, each of the electric modules having at least a capacitor or an inductor or a resistor; and varying the combination of the plurality of electric modules to achieve a resulting adjustable impedance for the connector, wherein the cover includes an elongated window spaced apart from the printed circuit board and above the plurality of electric modules mounted onto the printed circuit board for replacement or adjustment thereof through the elongated window thereabove.

8. The method for assembling the adjustable impedance high speed data connector as in claim 7, wherein the step of varying the combination of the plurality of electric modules includes the step of adjusting the capacitor or inductor of each of the plurality of electric modules.

9. The method for assembling the adjustable impedance high speed data connector as in claim 8, wherein the step of adjusting the capacitor or inductor of each of the plurality of electric modules includes the step of mechanically or electrically adjusting the capacitor or inductor of each of the plurality of electric modules.

10. A method for operating an adjustable impedance high speed data connector, comprising the steps of:

adjusting an impedance of a printed circuit board housed within a cover and a tray latched onto each other, the printed circuit board being mounted, in its entirety, onto a floor of the tray; and connecting one end of the connector to a first connector assembly and another end of the connector to a second connector assembly, wherein the cover includes an elongated window spaced apart from the printed circuit board and above the printed circuit board for adjusting the impedance thereof through the elongated window thereabove.

11. The method for operating the adjustable impedance high speed data connector as in claim 10, wherein the step of adjusting the impedance of the printed circuit board includes the step of adjusting a combination of electric modules connected onto the printed circuit board, each of the electric modules having a capacitor or an inductor.

12. The method for operating the adjustable impedance high speed data connector as in claim 10, wherein the step of adjusting the impedance of the printed circuit board includes the step of adjusting a capacitor or an inductor of at least an electric module connected onto the printed circuit board.

13. The method for operating the adjustable impedance high speed data connector as in claim 10, further comprising the step of matching an input impedance on the one end of the connector to an output impedance on the another end of the connector to reduce noise or interference in the signal through the connector.

14. The method for operating the adjustable impedance high speed data connector as in claim 13, wherein the step of matching the input impedance and the output impedance of the connector includes the step of maximizing output power in the connector.

15. The method for operating the adjustable impedance high speed data connector as in claim 10, wherein the step of adjusting the impedance of the printed circuit board within the connector allows the connector to operate at various ranges of bandwidths.

* * * * *